US010912218B1

(12) United States Patent
Cap et al.

(10) Patent No.: US 10,912,218 B1
(45) Date of Patent: Feb. 2, 2021

(54) CORROSION PREVENTION COVER FOR MODULE CONNECTOR IN A NETWORK DEVICE

(71) Applicant: CISCO TECHNOLOGY, INC., San Jose, CA (US)

(72) Inventors: Mehmet Onder Cap, Sunnyvale, CA (US); Marc Henry Mantelli, Los Gatos, CA (US); Giridharan Rajagopalan, Milpitas, CA (US); M. Baris Dogruoz, Santa Clara, CA (US); Robert Gregory Twiss, Chapel Hill, NC (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/571,588

(22) Filed: Sep. 16, 2019

(51) Int. Cl.
| | |
|---|---|
| *H05K 5/03* | (2006.01) |
| *H05K 7/14* | (2006.01) |
| *H05K 5/02* | (2006.01) |
| *H01R 13/453* | (2006.01) |
| *H01R 12/71* | (2011.01) |
| *H01R 12/70* | (2011.01) |
| *H01R 13/52* | (2006.01) |
| *H01R 13/447* | (2006.01) |

(52) U.S. Cl.
CPC ............ *H05K 5/03* (2013.01); *H05K 5/0239* (2013.01); *H05K 7/1427* (2013.01); *H01R 12/7082* (2013.01); *H01R 12/716* (2013.01); *H01R 13/447* (2013.01); *H01R 13/453* (2013.01); *H01R 13/5213* (2013.01); *H01R 13/5216* (2013.01)

(58) Field of Classification Search
CPC ............ H01R 13/5213; H01R 13/5216; H01R 12/716; H01R 12/7082; H01R 13/447; H01R 13/453
See application file for complete search history.

(56) References Cited

U.S. PATENT DOCUMENTS

| 3,475,657 | A | * | 10/1969 | Knowles | ................ | H01R 23/68 |
|---|---|---|---|---|---|---|
| | | | | | | 361/787 |
| 4,795,354 | A | * | 1/1989 | Owen | .................... | H01R 12/87 |
| | | | | | | 439/135 |
| 5,735,697 | A | * | 4/1998 | Muzslay | .............. | H01R 13/405 |
| | | | | | | 439/83 |
| 5,756,937 | A | * | 5/1998 | Gleadall | .............. | H01R 13/447 |
| | | | | | | 174/138 F |

(Continued)

FOREIGN PATENT DOCUMENTS

| CN | 109144187 A | 1/2019 |
|---|---|---|
| KR | 100731730 B1 | 6/2007 |

(Continued)

*Primary Examiner* — Tho D Ta
(74) *Attorney, Agent, or Firm* — Cindy Kaplan

(57) ABSTRACT

In one embodiment, an apparatus includes a cover configured for installation over a connector mounted on a printed circuit board and operable to couple a module to the printed circuit board, the cover comprises a lower surface for contact with the printed circuit board and a slot for receiving the module for attachment of the module to the connector. The cover encloses contacts at the connector for mating with the module and the printed circuit board to prevent corrosion of the contacts.

20 Claims, 14 Drawing Sheets

(56) References Cited

U.S. PATENT DOCUMENTS

| | | | |
|---|---|---|---|
| 7,101,196 B1 * | 9/2006 | McClelland | H01R 13/5213 |
| | | | 439/521 |
| 7,165,898 B2 | 1/2007 | Kato | |
| 7,435,111 B2 * | 10/2008 | Wu | H01R 12/57 |
| | | | 439/135 |
| 7,544,252 B1 | 6/2009 | Scea | |
| 8,536,454 B2 * | 9/2013 | Wang | H01R 13/5213 |
| | | | 174/53 |
| 9,332,674 B2 | 5/2016 | Campbell | |
| 9,356,381 B2 * | 5/2016 | Yi | H01R 13/4538 |
| 9,746,879 B2 | 8/2017 | Clayton | |
| 10,249,555 B2 | 4/2019 | Campbell | |
| 2009/0168374 A1 | 7/2009 | Clayton | |
| 2011/0143555 A1 * | 6/2011 | Pan | H01R 13/5213 |
| | | | 439/38 |

FOREIGN PATENT DOCUMENTS

| | | |
|---|---|---|
| KR | 20080063911 A | 7/2008 |
| WO | 2010005435 A1 | 1/2010 |

\* cited by examiner

CORROSION PREVENTION COVER FOR MODULE CONNECTOR IN A NETWORK DEVICE

TECHNICAL FIELD

The present disclosure relates generally to network devices in a communications network, and more particularly, to corrosion protection for components in a network device.

BACKGROUND

Network communications systems utilize network devices that include complex and sensitive electronic components. The network devices are typically designed to operate in a controlled environment such as data centers and central offices with controlled temperature, humidity, and air quality. However, network equipment is being deployed closer to a user base and deployments are often exposed to non-protected or partially protected outdoor environments. Network devices deployed in uncontrolled remote areas with high humidity, salt fog, hygroscopic dust, and other contaminants in the air often exhibit severe corrosion problems, which may reduce the operational life of the equipment or FRUs (Field Replaceable Units) within the equipment.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1:
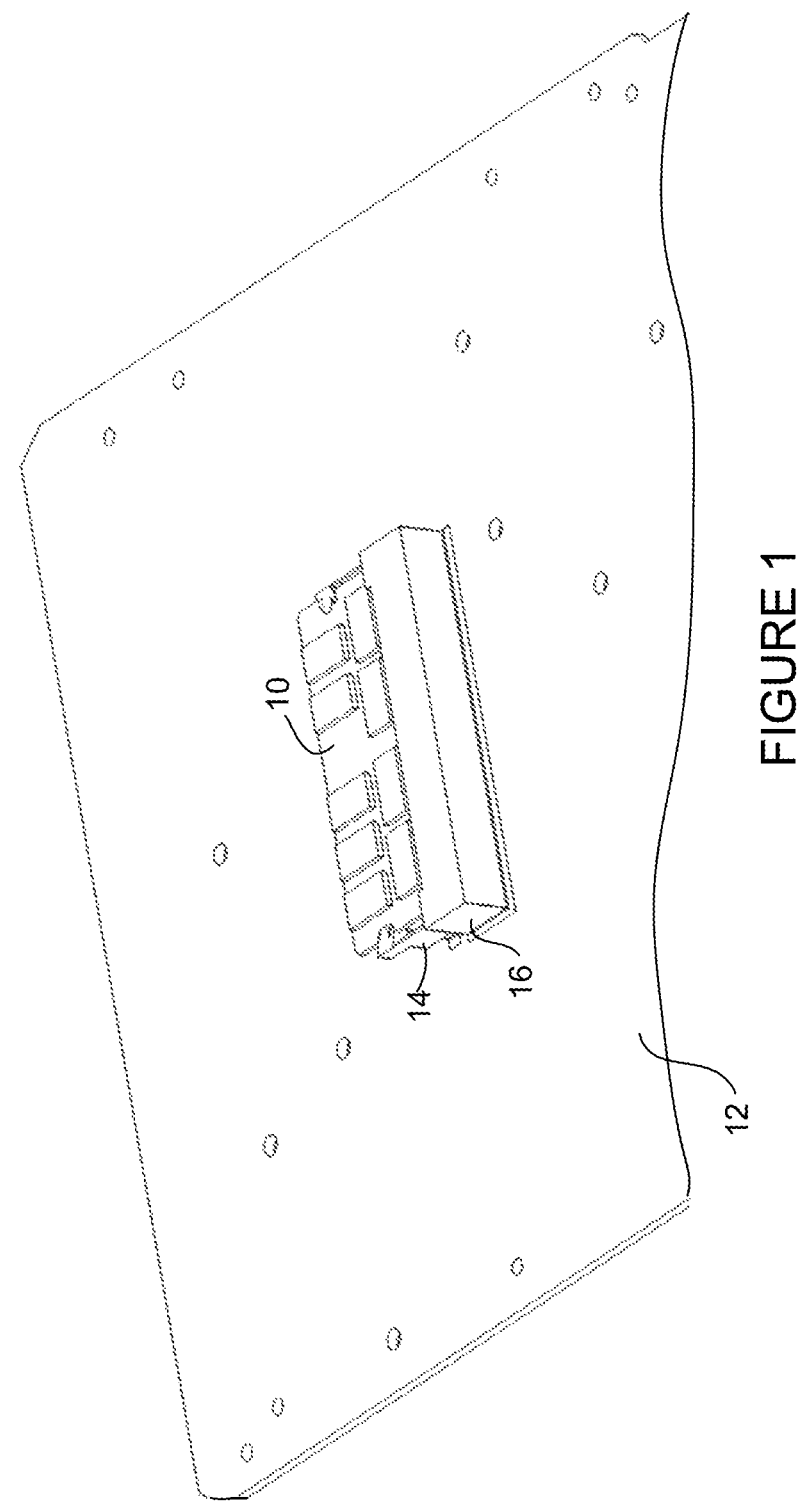
FIG. 1 is a perspective of a memory module coupled to a printed circuit board with a 90 degree connector and a corrosion prevention cover installed, in accordance with one embodiment.

In one embodiment, an apparatus generally comprises a cover configured for installation over a connector mounted on a printed circuit board and operable to couple a module to the printed circuit board, the cover comprises a lower surface for contact with the printed circuit board and a slot for receiving the module for attachment of the module to the connector. The cover encloses contacts at the connector for mating with the module and the printed circuit board to prevent corrosion of the contacts.

In one or more embodiments, the slot is defined by resiliently deformable flexible members configured to form a seal with outer surfaces of the module when the module is inserted into the cover. The resiliently deformable flexible members may comprise outer surfaces tapered towards the slot.

In one or more embodiments, the cover may be configured for sliding engagement with a 90 degree connector. In one or more embodiments, the cover may be configured for sliding engagement with a vertical connector.

In one or more embodiments, the cover comprises openings for receiving arms of the connector positioned adjacent to the module when the module is inserted into the connector.

In one or more embodiments, the cover comprises openings for receiving locking members of the connector.

In one or more embodiments, the cover defines an enclosure to protect the contacts from moisture and contaminants within cooling air flowing over the printed circuit board when installed in an operating network device.

In one or more embodiments, the cover reduces dissipation of heat from an interior of the cover when the cover is installed over the connector.

In one or more embodiments, the cover allows for an increase in temperature within an enclosure defined by the cover and the printed circuit board to reduce relative humidity within said enclosure and further prevent corrosion of the contacts when the cover is installed over the connector.

In another embodiment, an apparatus generally comprises a connector for mounting on a printed circuit board and coupling a module to the printed circuit board, the connector comprising contacts for mating with the module and the printed circuit board, a removable cover enclosing the contacts and comprising a lower surface for engagement with the printed circuit board, and a sealant located between at least a portion of an internal surface of the cover and the connector. The cover and the sealant reduce exposure of the contacts to contaminants and prevent corrosion of the contacts.

In yet another embodiment, an apparatus generally comprises a module, a printed circuit board, a connector mounted on the printed circuit board and coupling the module to the printed circuit board, and a cover enclosing contacts at a module to connector interface and a connector to printed circuit board interface, the cover comprising a slot for insertion of the module into the connector and removal of the module from the connector.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network communications devices are increasingly being used in uncontrolled or partially uncontrolled environments that have different conditions than a data center or central office. In many of these deployments, the network device has no environmental protection (or only partial protection) and may be directly exposed to ambient air. Based on the climatic conditions of the area, the ambient air may not only carry a lot of dust and moisture, but also different chemical compounds. The network device may be subjected to adverse environmental factors including temperature and humidity extremes, airborne particulates, chemical pollutants, and other contaminants. The environment in which the network device operates may not be conducive to prolonged operation and life of the equipment.

Although all types of outdoor equipment face these issues, the severity of the failure is typically higher for forced air cooled devices due to the high flow rate of contaminated air within equipment enclosures. In a forced air cooled network device, the contaminants in the air may react with metal used in electronic components and cause corrosion. Deployment of network devices in the presence of uncontrolled contamination in cooling air (e.g., dust, moisture, abrasive chemicals, water soluble salts, etc.), may lead to damage to FRUs (Field Replaceable Units). Failure of the network device or components may occur very quickly in an uncontrolled environment. These failures are not predictable and therefore create service interruption and high costs for replacement units. Since these failures are often not recoverable, the downtime associated with these failures may be significant.

One method for protecting components from corrosion is a conformal coating process that coats a printed circuit board with a thin film for protection of surface mounted components from corrosion. However, when the conformal coating is applied, reworking of components becomes difficult. For devices such as memory modules (e.g., DIMMs (Dual In-line Memory Modules)), eUSBs (embedded Universal Serial Buses), mSATA (miniature Serial Advanced Technology Attachment) drives, batteries, power supplies, SIM (Subscriber Identity Module) cards, memory sticks (M2), or other components that are coupled to the printed circuit board through a connector, the area around the connector cannot be coated.

The embodiments described herein provide a corrosion prevention cover (sleeve, shell, housing, enclosure, boot) configured to enclose and protect exposed contacts (e.g., pins, fingers, gold fingers, pads, leads, copper leads, wires) at a connector to printed circuit board interface and a connector to module interface for preventing (reducing, delaying) corrosion of the contacts. The corrosion prevention cover may be used, for example, to protect pins of a socket and contact fingers of a memory module that cannot be coated to help improve their durability when network devices are deployed in harsh environments.

As described in detail below, in one or more embodiments, an apparatus may comprise a cover for protecting a connector mounted on a printed circuit board and coupling (electrically, communicatively, physically) a module to the printed circuit board. The cover encloses (substantially encloses) contacts mating with the module and in communication with the printed circuit board (e.g., leads on the connector mating with fingers on the module, leads coupling the connector to the PCB) and comprises a slot for insertion or removal of the module into or from the connector and a lower surface for contact with the PCB. The cover reduces exposure of the contacts to contaminants (e.g., moisture, dust, salt, etc.) to prevent corrosion of the contacts.

It is to be understood that the term "module" as used herein may refer to any electronic device, field replaceable unit, card, memory device, drive, battery, USB, power supply, board, or other element coupled to a printed circuit board through a connector. The term "connector" as used herein may refer to a socket, receptacle, tray, arms, port, or other interface operable to couple the module to the printed circuit board. As described in detail below, contacts (pins, leads, contact members, fingers, gold fingers, pads, wires, copper elements) of the connector and module may be exposed to environmental conditions when installed in the network device. The corrosion prevention cover is configured to enclose exposed contacts (e.g., contacts at the module to connector interface, contacts at the connector to PCB interface) to prevent (e.g., delay, reduce, or prevent) corrosion of the contacts. The corrosion prevention cover encloses the contacts to protect the contacts from moisture or contaminants that may be present, for example, in cooling air flowing over the components (module, connector, PCB).

Referring now to the drawings, and first to FIG. 1, a memory module (e.g., DIMM) 10 is coupled to a printed circuit board (PCB) 12 through a connector (module connector) 14. A corrosion prevention cover 16 is installed over the connector 14 and mounted on the PCB 12, and the DIMM 10 is inserted through an opening (e.g., slot described below with respect to FIG. 3) in the cover and attached to the connector (end portion of DIMM inserted into socket). The corrosion prevention cover 16 encloses exposed contacts at the module to connector interface and connector to PCB interface.

Figure 5:
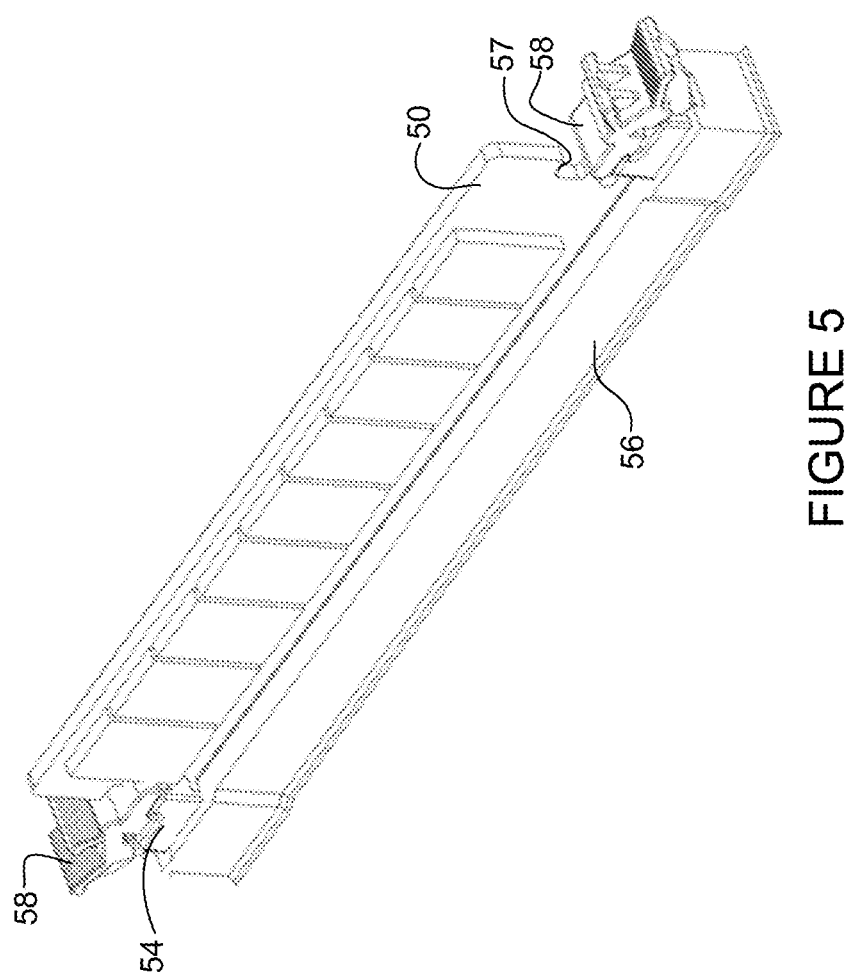
FIG. 5 is a perspective of a memory module and a vertical connector with a corrosion prevention cover installed, in accordance with one embodiment.

In the example shown in FIG. 1, the DIMM 10 is installed horizontally (e.g., 90 degrees relative to the PCB, generally parallel to the PCB) and the connector is referred to as a 90 degree or horizontal connector. The connector may also be configured for receiving the module at a different orientation (e.g., vertical connector as shown in FIG. 5 or any other angle). The PCB 12 may comprise any number of components (chips, memory, processors, power supplies, etc.) arranged in any format. One or more modules coupled to the PCB 12 through a connector may be protected by a corrosion prevention cover in accordance with the embodiments described herein.

As described below, the cover 16 is formed from a flexible material to provide for ease of installation of the cover over the connector 14, engagement of a bottom surface of the cover with the PCB 12, and insertion and removal of the module 10. The cover 16 is preferably configured with thin walls and a minimal footprint to prevent interference with adjacent components mounted on the PCB 12.

Figure 2:
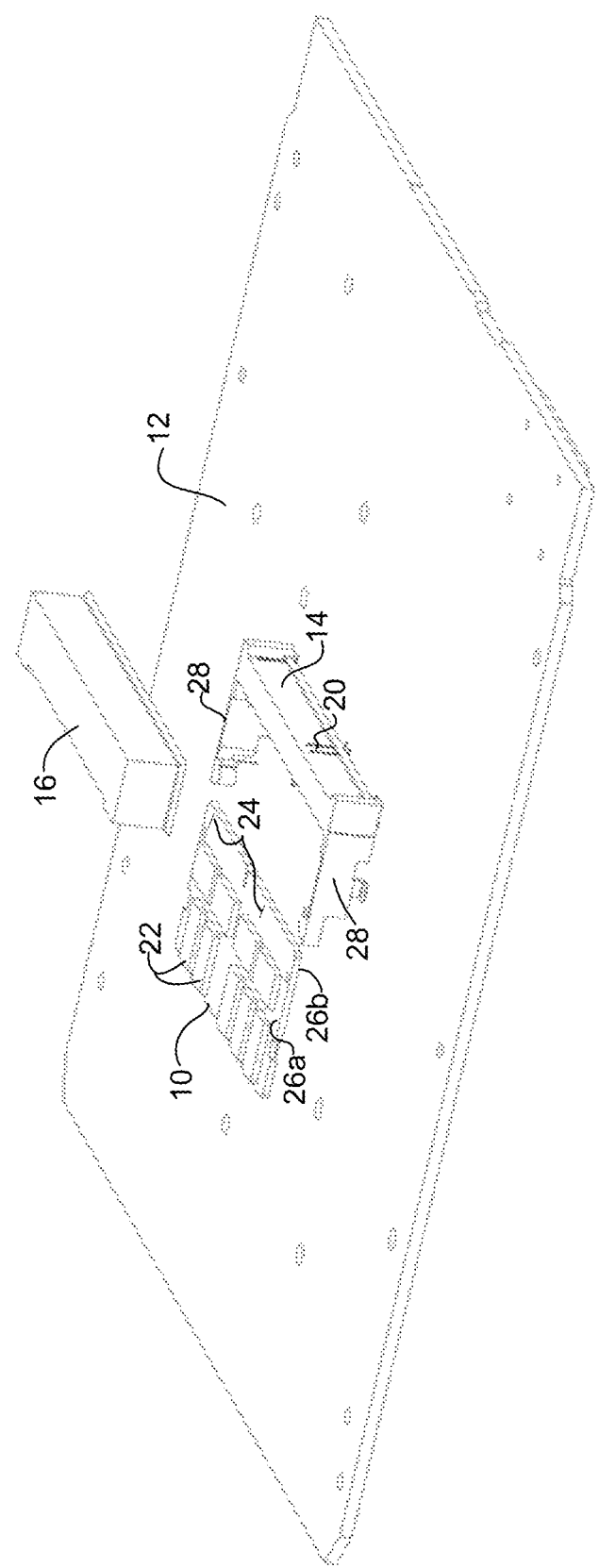
FIG. 2 is an exploded perspective of the memory module, connector, printed circuit board, and corrosion prevention cover shown in FIG. 1.

As shown in the exploded view of FIG. 2, the connector 14 comprises a plurality of exposed leads 20 (only a few shown for simplification) for electrical coupling of the connector to the PCB 12. In the example shown in FIG. 2, the memory module 10 comprises a plurality of memory chips 22 (e.g., DRAM (Dynamic Random Access Memory) integrated circuits) and contacts (pins, fingers) 24 (only two shown for simplification) for communication between the chips and the board 12 through the connector 14. The contacts 24 of the module 10 are coupled with the PCB 12 through the leads 20 on the connector 14. The module 10 may comprise any number of chips 22 and contacts 24 on one or both sides (upper side 26a, lower side 26b as viewed in FIG. 2) of the module. In the example shown in FIG. 2, the 90 degree connector comprises two arms 28 extending outward for receiving the module 10 therebetween (FIGS. 1 and 2). The arms 28 may comprise locking members or tabs for securely retaining the memory module 10 within the connector 14.

Figure 3:
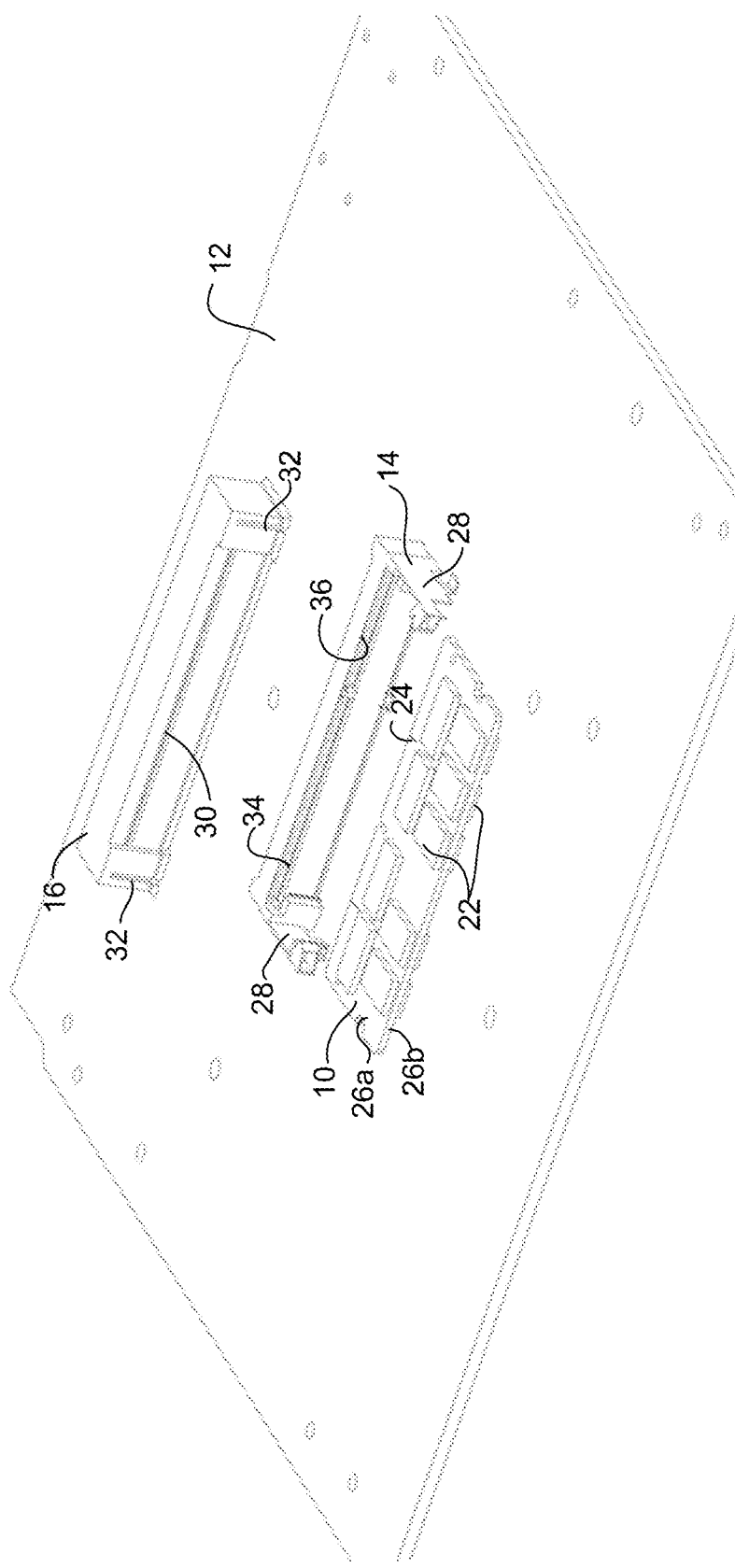
FIG. 3 is another exploded perspective of the memory module, connector, printed circuit board, and corrosion prevention cover shown in FIG. 1.

As can be seen in the exploded perspective shown in FIG. 3, the connector 14 comprises an opening (slot) 34 for receiving the module 10. The connector opening 34 comprises contacts 36 aligned for mating with the contacts 24 on the module 10 at the connector to module interface and in communication with the pins 20 (FIG. 2) at the connector to PCB interface. The corrosion prevention cover 16 comprises a horizontal slot 30 for slidable insertion of the module 10 into the cover and removal of the module from the cover and vertical slots 32 on opposite end portions to slide over arms 28 of the connector 14. As described below with respect to FIG. 4, flexible members (flaps) defining the slot 30 of the cover effectively form a seal with outer surfaces of the module (upper and lower external surfaces 26a, 26b of DIMM PCB) through resilient spring back of the flaps upon insertion of the module into the slot. The vertical slots 32 of the cover are also configured to minimize entry of contaminants into the enclosure created by the cover 16.

It is to be understood that the terms upper, lower, top, bottom, and the like as used herein are relative terms based on orientation of the board or network device and are provided as examples and not to be interpreted as limiting the orientation, arrangement, or layout of components.

Figure 4:
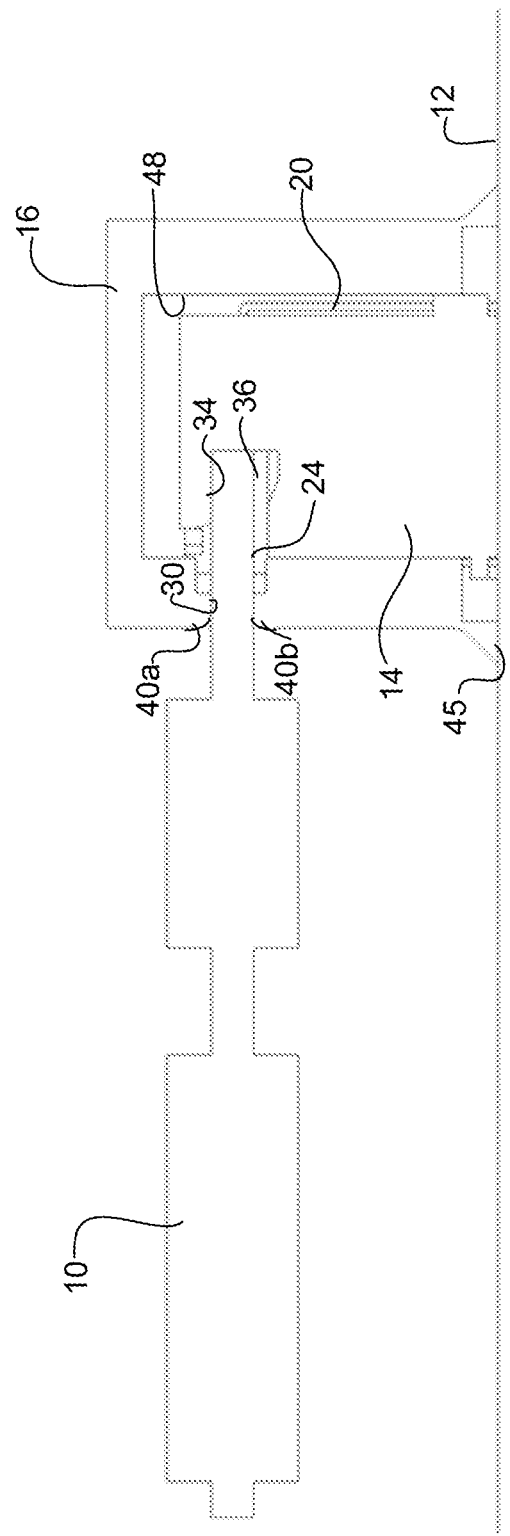
FIG. 4 is a cross-sectional view of the memory module, connector, printed circuit board, and corrosion prevention cover of FIG. 1.

FIG. 4 is a cross-sectional view of the module 10 inserted into the connector 14 with the cover 16 installed as shown in FIG. 1. The module 10 is inserted into the slot 30 of the cover 16 and contacts 24 on the module mate with the aligned contacts 36 in the connector opening 34. The cover 16 includes a lower surface 45 in contact with the PCB 12 to create an enclosure 48 protecting the contacts (e.g., fingers 24, leads 36 at the module to connector interface, contacts 20 at the connector to board interface).

The slot 30 of the cover 16 is defined by flexible resilient members (flaps) 40a, 40b that are generally in contact with one another in their relaxed state (no module inserted as shown in FIG. 3) and upon receiving the memory module 10 (as shown in FIG. 4) resiliently bend towards outer surfaces of the module for sealing engagement (substantially sealing engagement) to effectively create a seal between the cover 16 and module 10 and prevent entry of contaminants into the enclosure 48 defined by the cover and PCB 12.

The cover 16 may be formed from an elastically deformable material to engage with the module 10 and PCB 12 and create a seal at the cover to module interface and between the lower edge 45 of the cover 16 and the PCB (FIGS. 1 and 4). An adhesive material or sealant may be provided at the lower edge 45 to improve sealing between the cover 16 and PCB 12 or the seal may be formed from compression of the cover on the PCB when the module 10 is inserted into the cover. In one or more embodiments, the cover 16 is a one-piece element made of a molded elastomer material having suitable chemical resistance and material stability over a specified temperature range corresponding to operating conditions of the module 10, board 12, and surrounding components. The material may comprise, for example, rubber, silicone, or other suitable material.

FIG. 5 illustrates a memory module (DIMM) 50 inserted vertically into a connector 54 (180 degrees relative to the PCB) and a corrosion prevention cover 56 placed over the connector 54 to enclose exposed contacts between the module 50 and connector 54 or connector and PCB. The vertical connector 54 may include locking members 58 at opposite ends to mate with notches 57 in the module 50 to securely hold the module in place. The locking members 58 may be released to remove the module 50.

Figure 6:
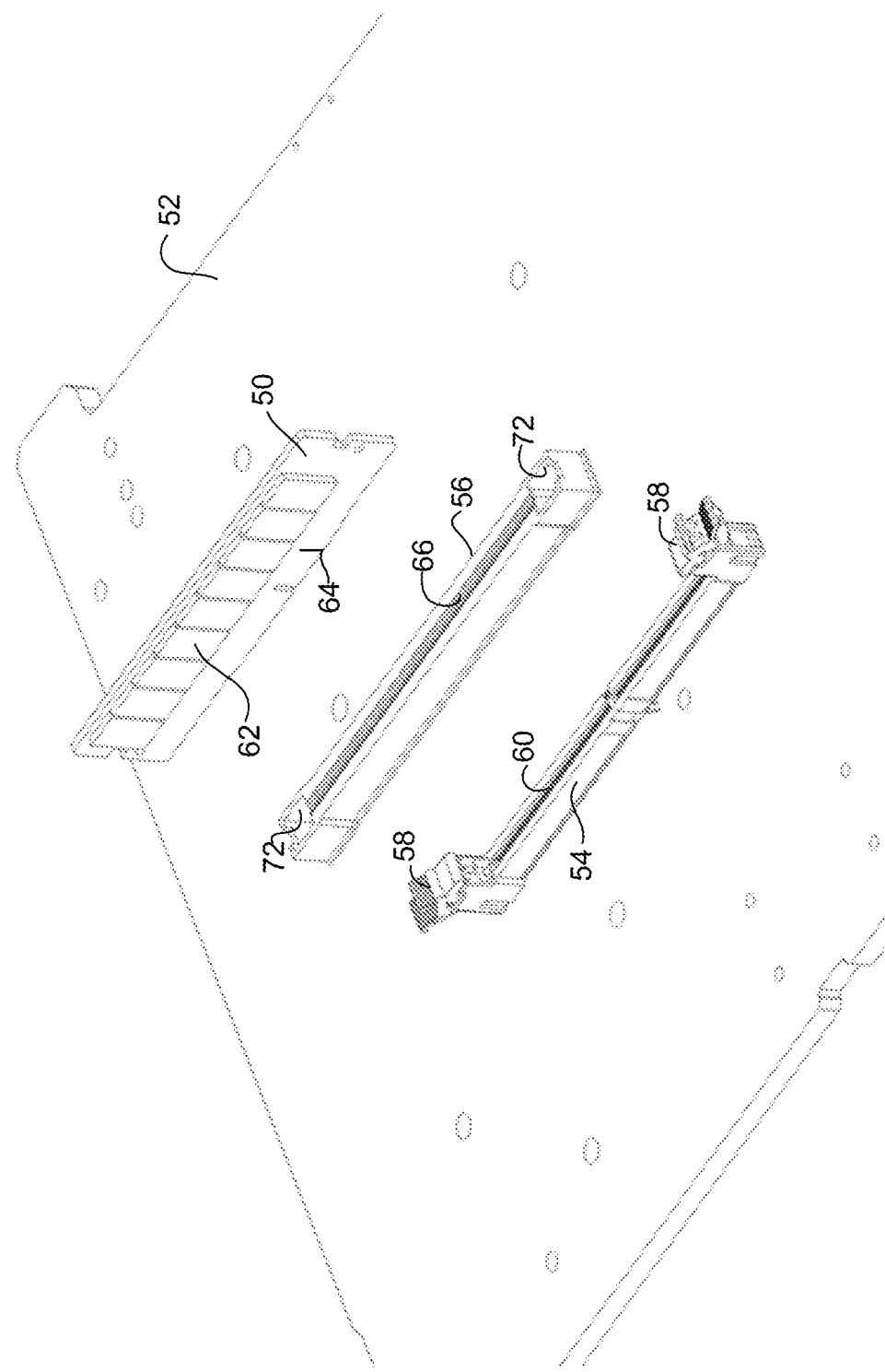
FIG. 6 is an exploded view of the memory module, connector, and corrosion prevention cover shown in FIG. 5.

FIG. 6 is an exploded view of the memory module 50, connector 54, and corrosion prevention cover 56. The connector 54 is mounted on a PCB 52. As previously noted, any number of components may be mounted on the PCB in any arrangement and one or more of the components may include a corrosion prevention cover (16, 56) (FIGS. 1 and 6). The connector 54 includes an opening (slot) comprising contacts 60 for mating with contacts (fingers) 64 (only one shown for simplification) on the module 50. As previously described, the module 50 may comprise any number of contacts (pins, fingers) on one or both sides of the module and any number of chips 62. An upper surface of the cover 56 comprises a slot 66 for insertion or removal of the module 50. Each end of the cover 56 includes openings 72 for receiving the locking members 58 of the connector 54.

Figure 7A:
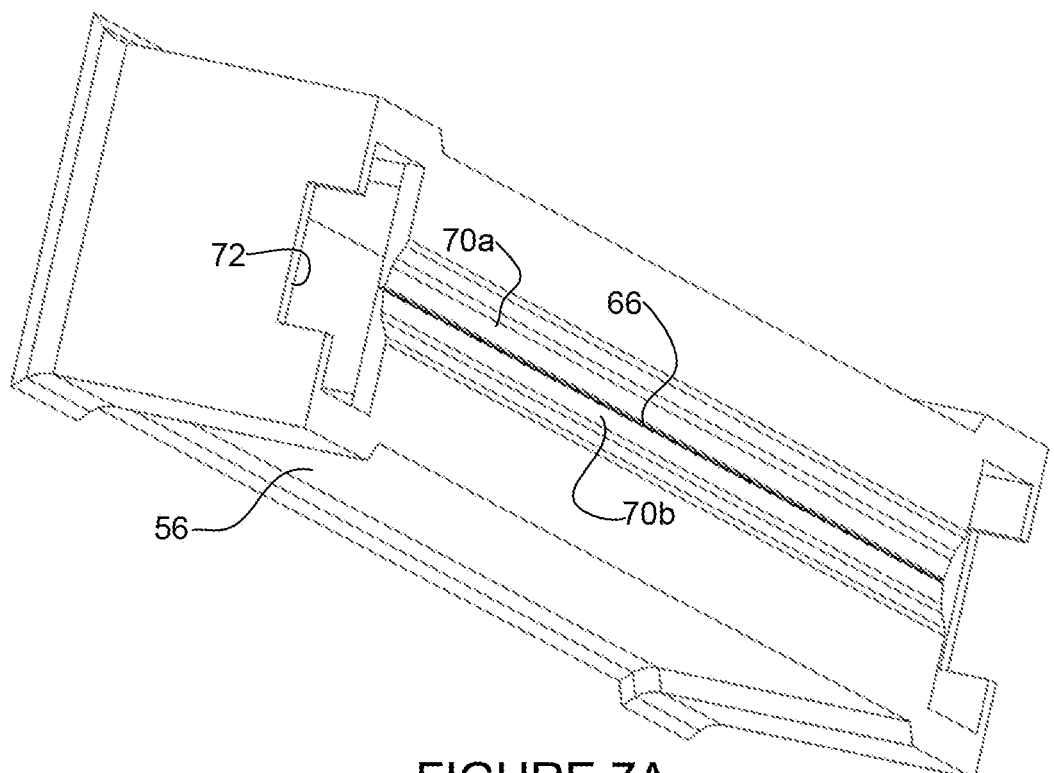
FIG. 7A is a top perspective of the corrosion prevention cover shown in FIGS. 5 and 6.
Figure 7B:
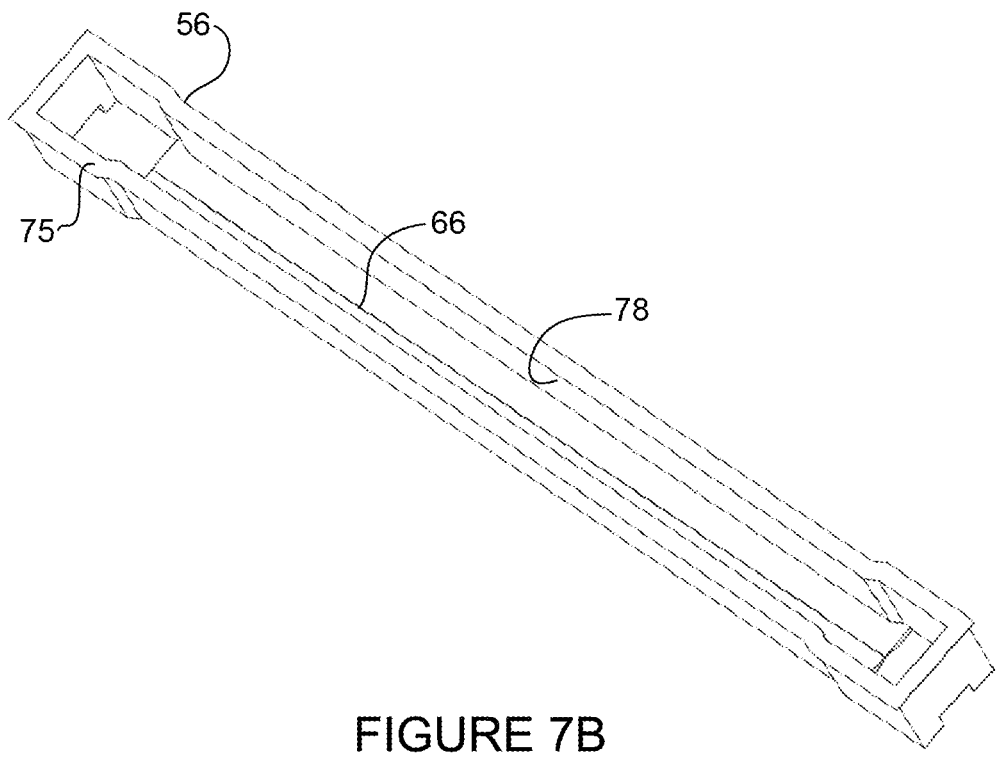
FIG. 7B is a bottom perspective of the corrosion prevention cover shown FIG. 7A.

FIG. 7A is a top perspective of the cover 56 and FIG. 7B is a bottom perspective of the cover. The slot 66 is defined by mating flaps (flexible members) 70a, 70b, without the module inserted. In one or more embodiments, an outer surface of the flaps 70a, 70b are tapered to provide a sealing surface against the module 50 when inserted into the cover, described below with respect to FIG. 8. As shown in FIG. 7B, a lower surface 75 of the cover 56 comprises an edge margin for mating with the PCB 52 (FIG. 6) to substantially create a seal and define a generally moisture and particulate resistant enclosure (interior of cover) 78 to prevent corrosion of the enclosed contacts at the module and connector.

Figure 8:
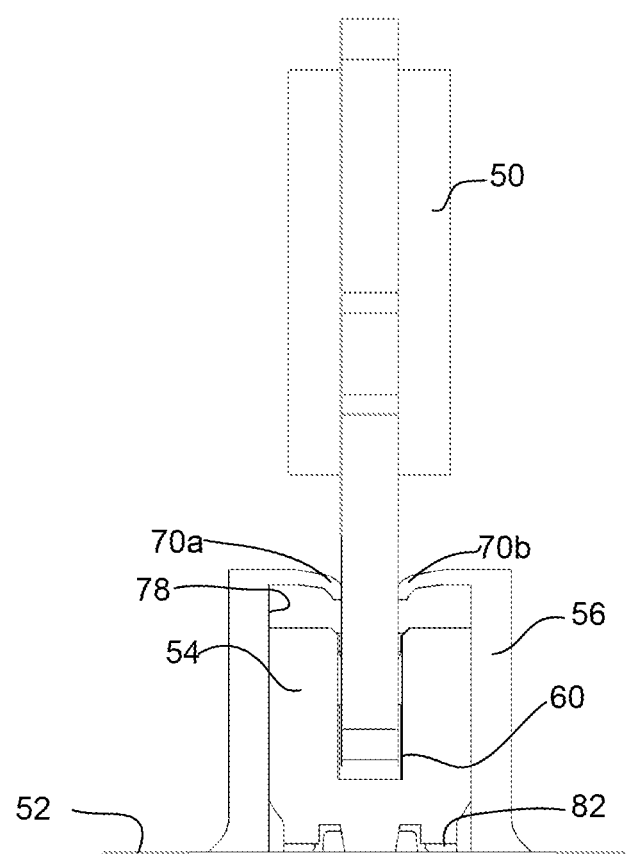
FIG. 8 is a cross-sectional view of the memory module, connector, printed circuit board, and corrosion prevention cover shown in FIG. 5.

FIG. 8 is a cross-sectional view of the connector 54 mounted on the PCB 52 with the memory module 50 inserted into the connector and cover 56. As previously noted, in one or more embodiments, the upper outer surface of the flexible members 70a, 70b are tapered downward towards the slot 66 to provide improved sealing against the module 50 and prevent entry of contaminants into enclosure 78 defined by the cover 56 and PCB 52 (FIGS. 7A, 7B, and 8).

The contamination protection and corrosion prevention provided by the cover 56 may be further enhanced by combining with a removable or 'strippable' sealant material (seal coating, sealant, adhesive) 90a, 90b as shown in FIG.

Figure 9:
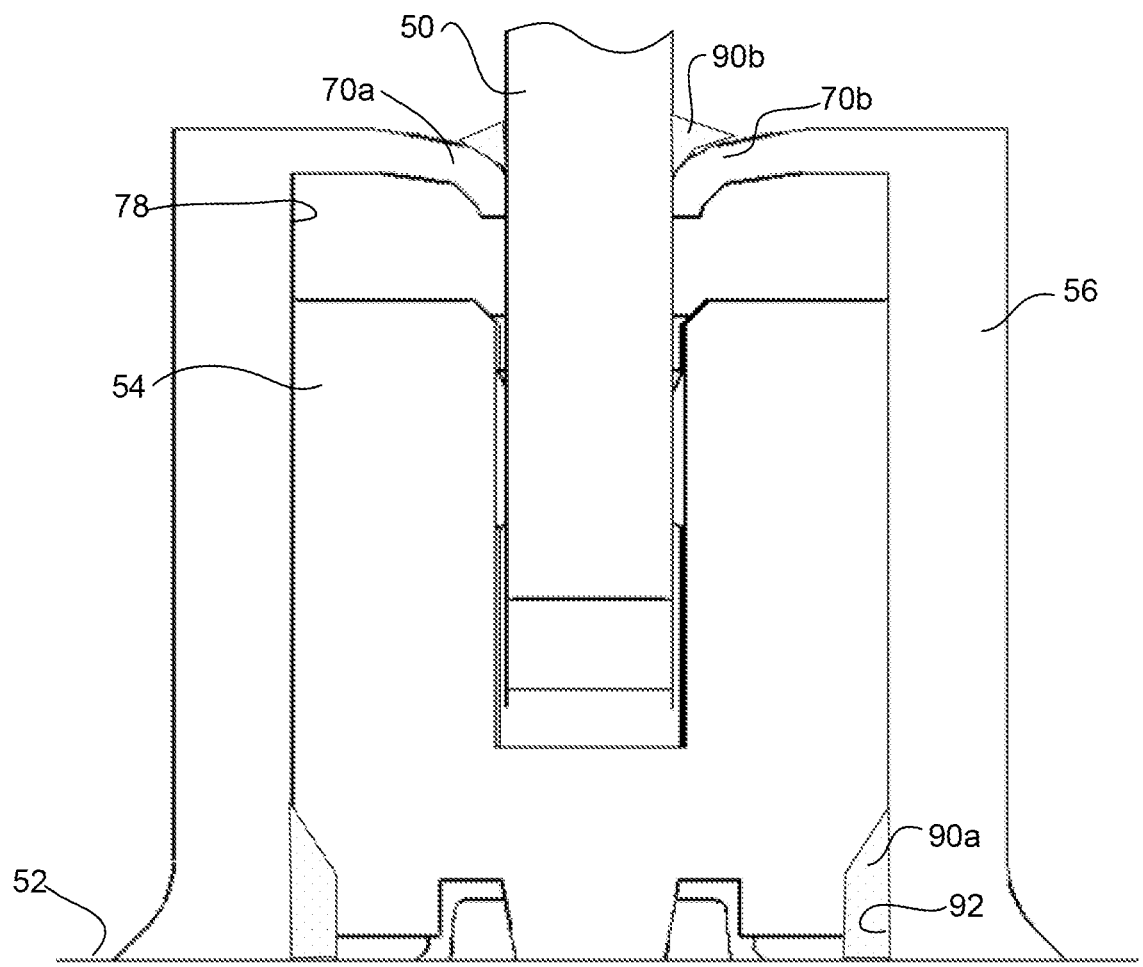
FIG. 9 is a partial cross-sectional view of the memory module, connector, and corrosion protection cover shown in FIG. 8 with an adhesive applied as a secondary seal, in accordance with one embodiment.

9. FIG. 9 is an enlarged cross-sectional view of the connector 54 mounted on the PCB 52 with the memory module 50 inserted into the connector and cover 56. In this example, the sealant is applied as a secondary seal to further protect the contacts. In one or more embodiments, the sealant may be placed at least partially between an internal surface of the cover 56 and an external surface of the connector 54. For example, as shown in FIG. 9, sealant 90a may be applied along a lower edge of the connector 54 at a gap 92 defined between the connector and the cover 56. In one example, a thin strip of adhesive is applied from a tube (e.g., small caulking gun) to an external surface of the connector 54 at the gap 92 between the PCB 52 and the DIMM connector 54 lower edge. The cover 56 may then be placed over the connector 54 with its lower internal edge margin positioned adjacent to (and mating with) the sealant 90a.

In one example, the sealant 90b may be applied after the module 50 is inserted into the cover 56 and connector 54 to provide a strip of adhesive between outer surfaces of the module 50 and the flexible members 70a, 70b defining the slot in the cover. The flaps 70a, 70b may, for example, start in a vertical (open) position and then folded downward approximately ninety degrees after the adhesive is deposited at the DIMM socket and board interface. This would allow the adhesive to flow into open gaps and fix the flaps in the down position to protect the adhesive material.

It is to be understood that only sealant 90a may be used, only sealant 90b may be used, or both the sealant 90a and 90b may be used together.

In one or more embodiments, the sealant 90a, 90b may comprise a fugitive adhesive or a strippable film.

The fugitive adhesive may have substantially the same adherent properties as an adhesive, however, it also possess the ability to be removed mechanically after application as a contiguous mass and not leave material residue. An example of such a fugitive adhesive is 3M™ Hot Melt Adhesive 3798LM. This particular material may be heated in an applicator "gun" and applied as a hot (e.g., approximately 250° F.) liquid. Once cooled, this adhesive retains an adherent "tacky" property, but it also can be mechanically peeled from surfaces if desired. One advantage of liquid application is that the adhesive will tend to flow readily into gaps, crevices, and voids, facilitating substantially complete filling or sealing of the target object. The cooled material may then serve as both an adhesive, effectively facilitating joining two or more parts, and as a barrier or sealant against moisture and fluids, particulate residue, and other airborne contaminants.

The strippable film may be a relatively thin (e.g., approximately 3-5 mils) polymeric film such as polyurethane, vinyl chlorides, or acrylic polymers mixed with other thickening and bonding agents. The film may be applied by brush or spray, for example. Once cured, the resultant film provides an environmental barrier that may be peeled or stripped away when needed.

Figure 10A:
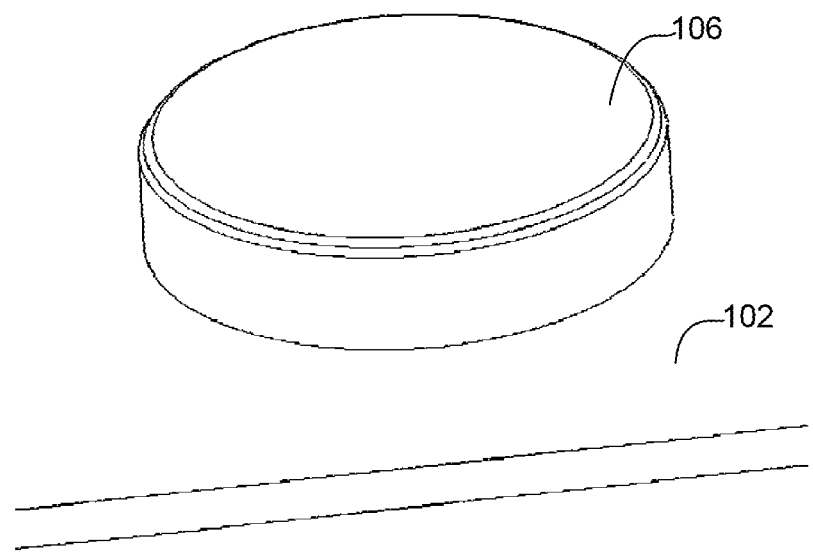
FIG. 10A is a perspective of a battery cover mounted on a battery installed on a printed circuit board, in accordance with one embodiment.
Figure 10B:
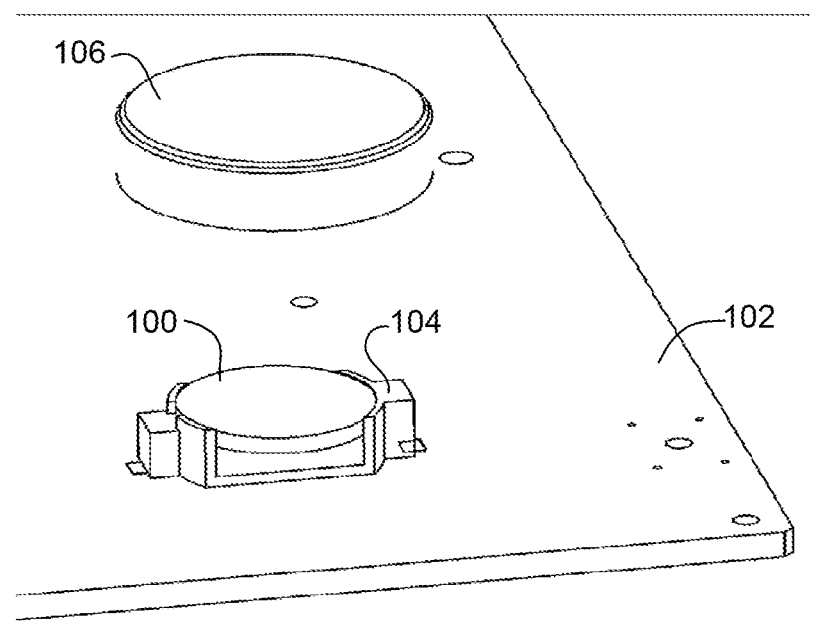
FIG. 10B is an exploded perspective of the battery cover and battery installed in a connector.

FIGS. 10A and 10B illustrate an example of a module cover partially filled with the sealant. In this example, the module comprises a battery 100 inserted into a battery socket (connector) 104 and a cover 106 is installed over the module and connector. The connector 104 couples the battery 100 to a printed circuit board 102.

Figure 11:
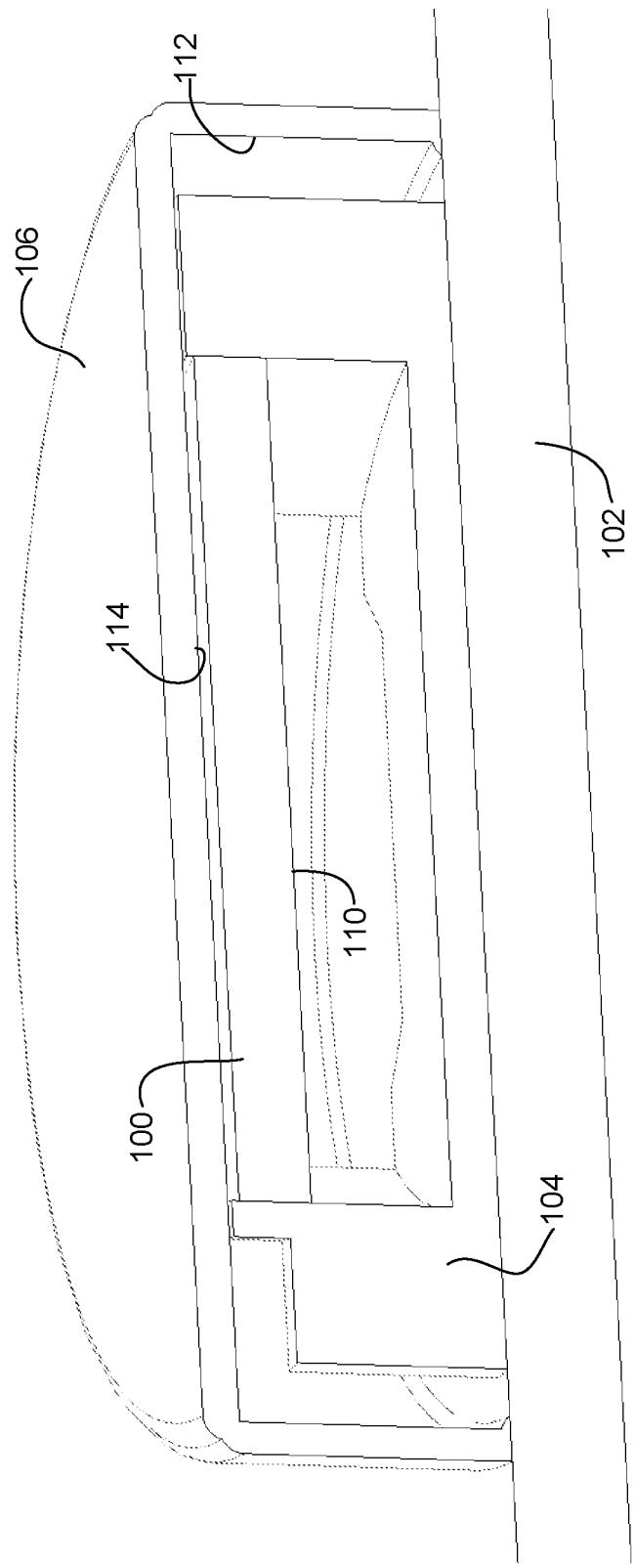
FIG. 11 is a cross-sectional perspective of the battery, connector, and cover shown in FIG. 10A.

FIG. 11 is a cross-sectional perspective of the battery (module) 100 inserted into the connector 104 with the cover 106 installed. A lower external surface 110 comprises a battery contact that mates with a connector contact (e.g., finger). The cover 106 prevents entry of contaminants into the enclosure and prevents corrosion of the contacts. An internal surface of the cover 106 defines a circumferential gap 112 between the connector 104 and cover, and a horizontal gap 114 between an upper surface of the battery 100 and the cover.

Figure 12A:
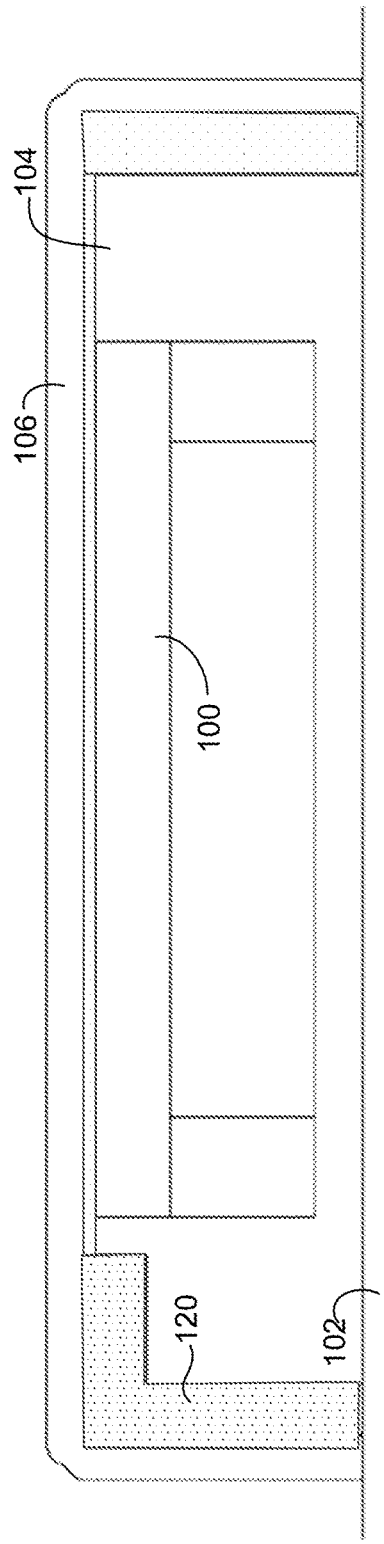
FIG. 12A is a cross-sectional view of the battery, connector, and cover with a sealant placed between the battery and cover.
Figure 12B:
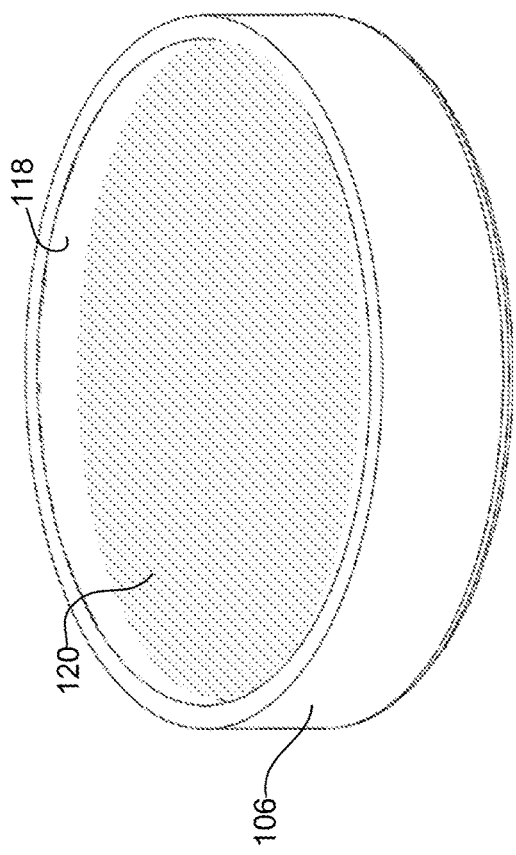
FIG. 12B is a bottom perspective of the cover partially filled with the adhesive.

As shown in FIGS. 12A and 12B, a sealant 120 may be placed within the cover 106 to fill the gaps 112, 114 shown in FIG. 11 and provide a secondary seal. FIG. 12B shows an internal surface 118 of the cover 106 and illustrates how the cover 106 may be partially filled with the sealant 120 before the cover is positioned over the battery 100 and connector 104 (FIG. 12A). In one or more embodiments, the cover 106 may include an internal fill line marking to ensure proper adhesive volume. The cover 106 may also include one or more short vertical walls to increase bonding area between the cap and adhesive.

It is to be understood that the modules 10, 50, 100 and connectors 14, 54, 104 shown in FIGS. 1-12A and described above are only examples and that the corrosion prevention cover 16, 56, 106 may be used to protect any contacts (e.g., copper leads, fingers) that cannot be conformal coated. For example, the corrosion prevention cover may be used with card edge connectors including, but not limited to memory cards (e.g., DIMM), expansion cards, power supplies, eUSBs, SIM cards, battery sockets, board-to-board connectors, or any other modules or connectors that comprise contacts that are susceptible to corrosion.

Figure 13A:
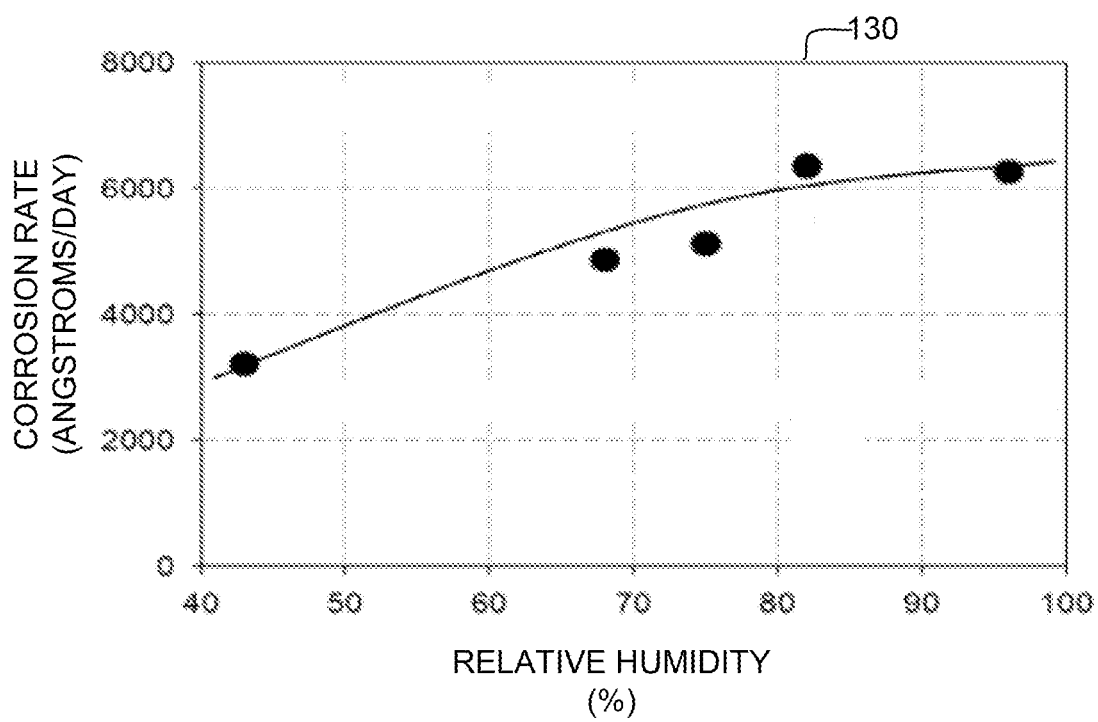
FIG. 13A is a graph illustrating an example of corrosion rate of copper based on relative humidity.
Figure 13B:
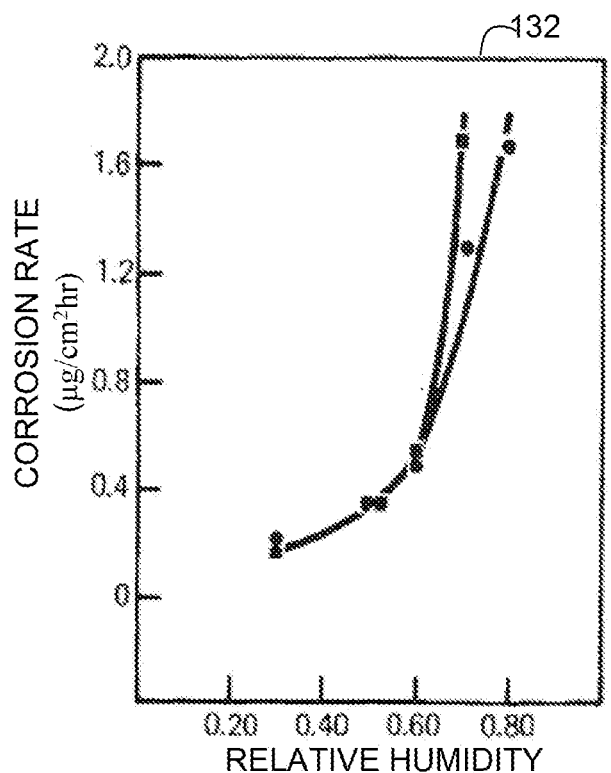
FIG. 13B is a graph illustrating another example of corrosion rate of copper based on relative humidity.

As shown in FIGS. 1, 5 and 11, and described above, the cover 16, 56, 106 encloses the contacts at the module to connector interface and connector to board interface to prevent corrosion of the contacts. The corrosion prevention cover 16, 56 is preferably formed from a material that does not conduct heat well, therefore, heat generated by the components or board and transferred to the module or connector contacts will result in an increase in temperature within the cover enclosure. The cover provides a higher thermal resistance when installed over the connector, such that the heat conducted from the printed circuit board cannot be dissipated into an air stream (air flow over the components) as efficiently as in the absence of the cover. The cover therefore reduces (e.g., prevents, attenuates) dissipation of heat from an interior of the cover when the cover is installed over the connector. As temperature increases within the cover enclosure, the relative humidity decreases, thereby reducing corrosion rate at the contacts. Copper corrosion rate, for example, significantly increases with increasing relative humidity rates in the absence of other reactants, as shown in graphs 130, 132 of FIGS. 13A and 13B illustrating examples of corrosion rate in copper versus relative humidity. In environments in which reactive sulfide is present, the corrosion increases substantially as the sulfide content increases. With the corrosion prevention cover 16, 56, 106 in place, the local temperature of the air increases with lower relative humidity, thus reducing corrosion rate and increasing lifetime expectancy of the components.

In one example, the embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. The network devices may communicate over or be in communication with one or more networks, which may include any number or arrangement of network communications devices (e.g., switches, access points, routers, or other devices) operable to route (switch, forward) data communications.

Figure 14:
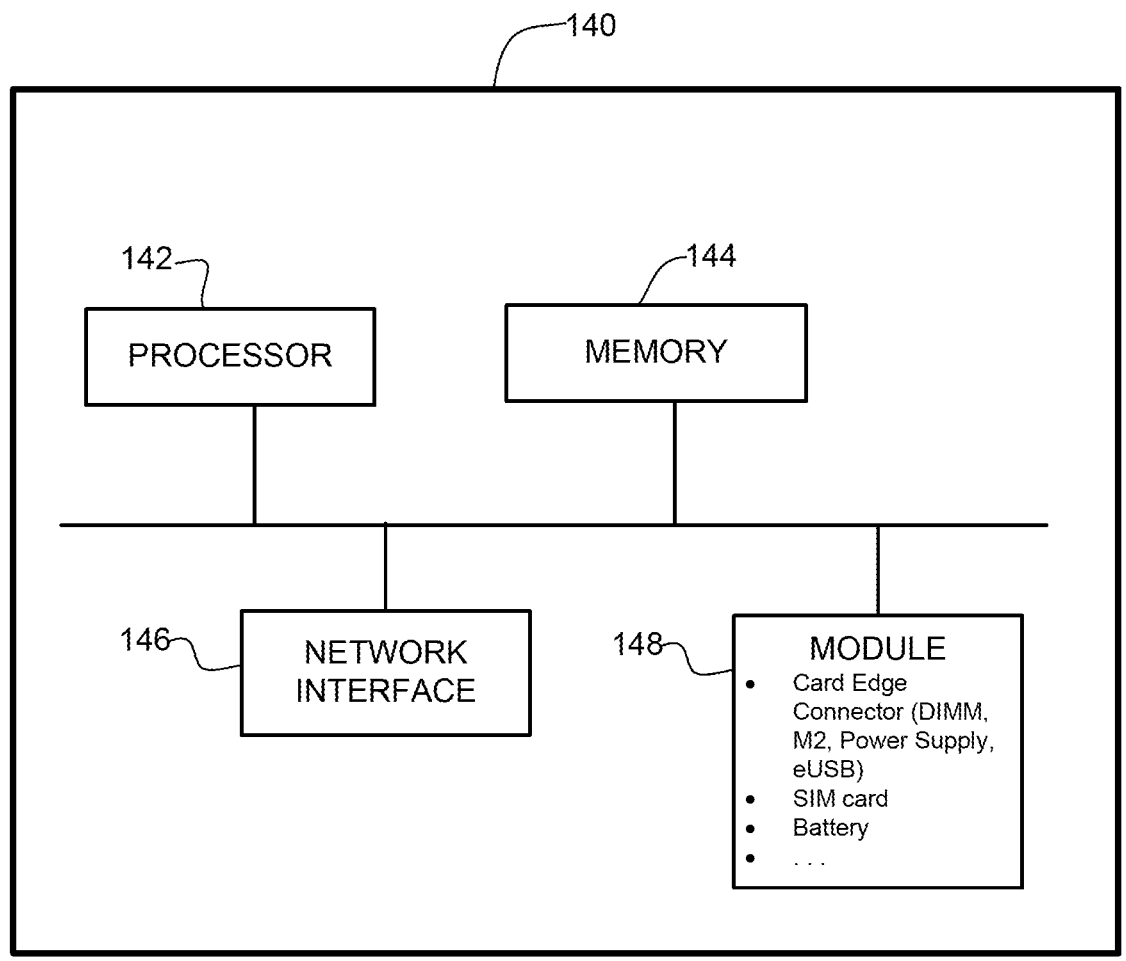
FIG. 14 is a block diagram depicting an example of a network device in which the embodiments described herein may be implemented.

FIG. 14 illustrates an example of a network device 140 that may implement the embodiments described herein. In one or more embodiments, the network device 140 is a programmable machine that may be implemented in hardware, software, or any combination thereof. The network device 140 includes one or more processor 142, memory 144, network interface (port) 146, and module (e.g., card edge connector, SIM card, battery, and the like) 148.

Memory 144 may be a volatile memory or non-volatile storage, which stores various applications, operating systems, modules, and data for execution and use by the processor 142. Memory 144 may include one or more of the modules 148. The network device 140 may include any number of memory components, including for example, any number of memory modules (e.g., DIMMs) that are protected from corrosion using the corrosion prevention cover described herein.

Logic may be encoded in one or more tangible media for execution by the processor 142. For example, the processor 142 may execute codes stored in a computer-readable medium such as memory 144. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 140 may include any number of processors 142.

The network interface 146 may comprise any number of interfaces (line cards, ports) for receiving data or transmitting data to other devices.

It is to be understood that the network device 140 shown in FIG. 14 and described above is only an example and that different configurations of network devices may be used. For example, the network device 140 may further include any suitable combination of hardware, software, algorithms, processors, devices, components, or elements operable to facilitate the capabilities described herein. Also, it is to be understood that the embodiments described herein are not limited to use in a network device and may be used in any type of electronic equipment with components that are susceptible to corrosion.

Although the method and apparatus have been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a module comprising a plurality of memory chips;
   a cover configured for installation over a connector mounted on a printed circuit board and operable to couple the module to the printed circuit board, the cover comprising:
      a lower surface for contact with the printed circuit board; and
      a slot for receiving the module for attachment of the module to the connector;
   wherein the cover encloses contacts at the connector for mating with the module and the printed circuit board to prevent corrosion of the contacts and wherein at least a portion of the memory chips are located external to the cover.

2. The apparatus of claim 1 wherein the slot is defined by resiliently deformable flexible members configured to form a seal with outer surfaces of the module when the module is inserted into the cover.

3. The apparatus of claim 2 wherein the resiliently deformable flexible members comprise outer surfaces tapered towards the slot.

4. The apparatus of claim 1 wherein the cover is configured for sliding engagement with the connector and wherein the connector is configured for receiving the module positioned generally parallel to the printed circuit board.

5. The apparatus of claim 1 wherein the cover is configured for sliding engagement with the connector and wherein the connector is configured for receiving the module positioned generally perpendicular to the printed circuit board.

6. The apparatus of claim 1 wherein the cover comprises openings for receiving locking members of the connector.

7. The apparatus of claim 1 wherein the cover defines an enclosure to protect the contacts from moisture and contaminants within cooling air flowing over the printed circuit board when installed in an operating network device.

8. The apparatus of claim 1 wherein the cover reduces dissipation of heat from an interior of the cover when the cover is installed over the connector, such that the heat conducted from the printed circuit board cannot be dissipated efficiently into an air stream.

9. The apparatus of claim 1 wherein the cover allows for an increase in temperature within an enclosure defined by the cover and the printed circuit board to reduce relative humidity within said enclosure and further prevent corrosion of the contacts when the cover is installed over the connector.

10. The apparatus of claim 1 wherein a sealant is applied to at least a portion of an external surface of the connector.

11. The apparatus of claim 1 wherein a sealant is applied between an outer surface of the module and flexible members of the cover defining the slot.

12. An apparatus comprising:
    a cover configured for installation over a connector mounted on a printed circuit board and operable to couple a module to the printed circuit board, the cover comprising:
       a lower surface for contact with the printed circuit board; and
       a slot for receiving the module for attachment of the module to the connector;
    wherein the cover encloses contacts at the connector for mating with the module and the printed circuit board to prevent corrosion of the contacts and wherein the cover comprises openings for receiving arms of the connector positioned adjacent to the module when the module is inserted into the connector.

13. The apparatus of claim 12 wherein the module comprises a memory card.

14. An apparatus comprising:
    a connector for mounting on a printed circuit board and coupling a module to the printed circuit board, the connector comprising contacts for mating with the module and the printed circuit board;
    a removable cover enclosing the contacts and comprising a lower surface for engagement with the printed circuit board; and
    a removable sealant located between at least a portion of an internal surface of the cover and the connector;

wherein the cover and the sealant reduce exposure of the contacts to contaminants and prevent corrosion of the contacts.

15. The apparatus of claim 14 wherein the sealant comprises a fugitive adhesive.

16. The apparatus of claim 14 wherein the sealant comprises a strippable film.

17. The apparatus of claim 14 wherein the module comprises a battery and the connector comprises a battery socket.

18. An apparatus comprising:
    a memory module;
    a printed circuit board;
    a connector mounted on the printed circuit board and coupling the module to the printed circuit board; and
    a cover enclosing contacts at a module to connector interface and a connector to printed circuit board interface, the cover comprising a slot for insertion of the module into the connector and removal of the module from the connector without removal of the cover.

19. The apparatus of claim 18 further comprising a sealant applied to at least a portion of an external surface of the connector.

20. The apparatus of claim 18 wherein the cover allows for an increase in temperature within an enclosure defined by the cover to reduce relative humidity within said enclosure and further prevent corrosion of the contacts.

* * * * *